United States Patent [19]

Yagihashi

[11] Patent Number: 4,473,894
[45] Date of Patent: Sep. 25, 1984

[54] SHIFT CIRCUIT WHICH NEED NO TRANSFORMATION BETWEEN NINE-BIT-BYTE AND EIGHT-BIT-BYTE DATA

[75] Inventor: Toshio Yagihashi, Tokyo, Japan

[73] Assignee: Nippon Electric Co., Ltd., Tokyo, Japan

[21] Appl. No.: 391,256

[22] Filed: Jun. 23, 1982

[30] Foreign Application Priority Data

Jul. 3, 1981 [JP] Japan ................................ 56-104830

[51] Int. Cl.³ ............................................ G11C 13/00
[52] U.S. Cl. ...................................... 365/189; 365/78
[58] Field of Search .......................... 365/189, 230, 78

[56] References Cited

U.S. PATENT DOCUMENTS 4,395,764 7/1983 Matsue .................................. 365/78

*Primary Examiner*—Terrell W. Fears
*Attorney, Agent, or Firm*—Sughrue, Mion, Zinn, Macpeak & Seas

[57] ABSTRACT

For use in a packed nine-bit-byte data processing system, a shift circuit comprises a shifter for subjecting a datum given by a bit sequence of nine-bit bytes to a shift of a preselected whole number N of digits or, more particularly, a shift of [9N/2] and [9(N−1)/2+5] bits when the whole number is an even and an odd integer, respectively. Before written in a register, the shifted bit sequence is edited by an editor into an edited bit sequence wherein each prescribed binary bit in each nine-bit byte is produced as it stands when the whole number is even and is placed, when the whole number is odd, at a next more significant bit than a four-bit byte which is next more significant in the shifted sequence than that binary bit.

3 Claims, 9 Drawing Figures

FIG. 5
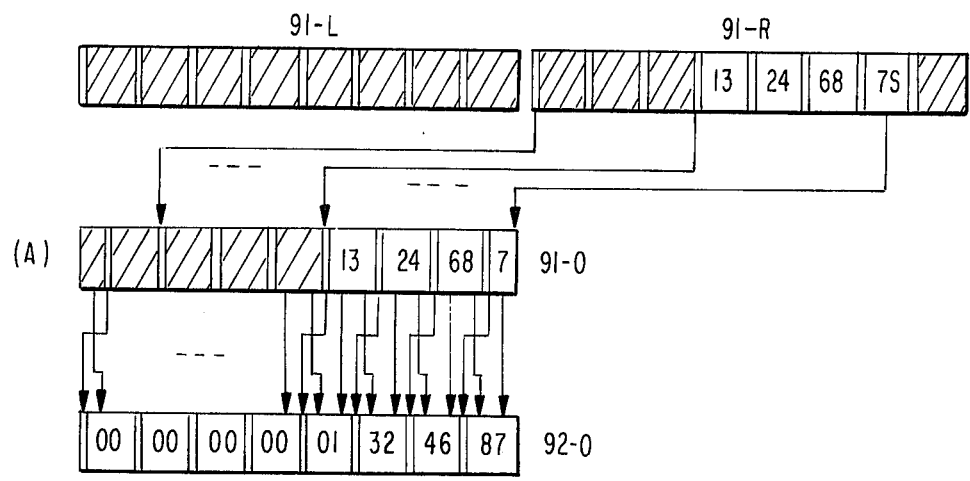
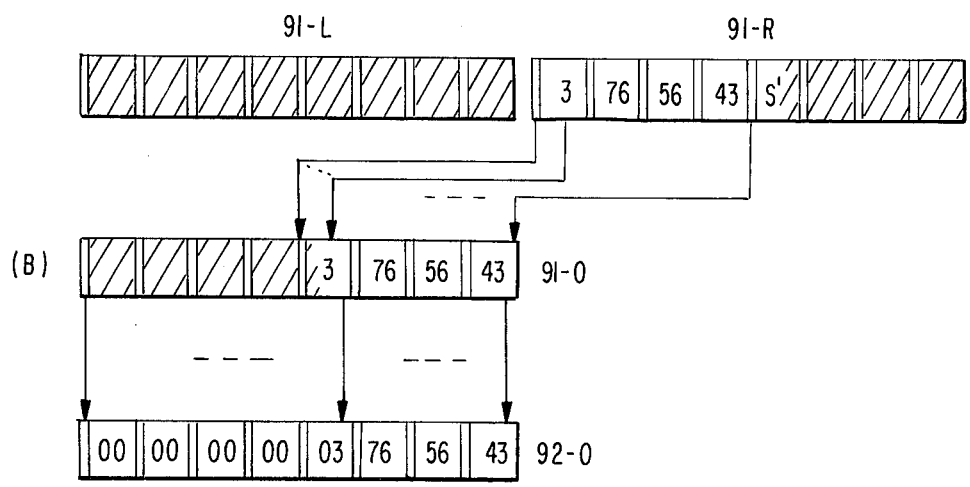
FIG. 7
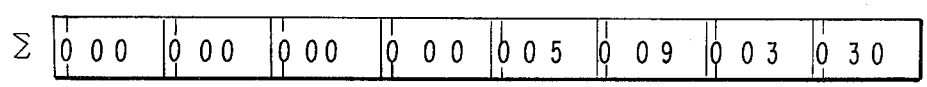

SHIFT CIRCUIT WHICH NEED NO TRANSFORMATION BETWEEN NINE-BIT-BYTE AND EIGHT-BIT-BYTE DATA

BACKGROUND OF THE INVENTION

This invention relates to a shift circuit for use in a packed nine-bit-byte data processing system. The nine-bit-byte data are usually representative of binary-coded decimal numbers, respectively.

A packed nine-bit-byte decimal data processing system is disclosed in U.S. Pat. No. 4,251,864 issued to Jerry L. Kindell et al and assigned to Honeywell Information Systems Inc. The system comprises means for carrying out transformation between two data formats.

As will later be described with reference to one of several figures of the accompanying drawing, a datum of one of the data formats is given by a bit sequence of a prescribed number of nine-bit bytes, such as eight nine-bit bytes, consecutively arranged from the most significant bit of the sequence to the least significant bit thereof. Each nine-bit byte consists of a prescribed binary bit, a first four-bit byte, and a second four-bit byte which are consecutively arranged in a direction or sense from the most significant bit to the least significant bit. The prescribed binary bit is representative of a prescribed one of two binary numbers, such as binary zero and one.

Before subjecting such a datum to an arithmetic operation, the datum is transformed into a datum of the other data format. The transformed datum is given by another bit sequence of eight-bit bytes. More particularly, each nine-bit byte is transformed into an eight-bit byte by stripping the prescribed binary bit from the nine-bit byte under consideration.

Such transformed data are supplied to a decimal arithmetic unit and furthermore to a shift circuit and are subjected to an arithmetic operation specified by an instruction. Upon completion of the arithmetic operation, a resulting datum is given by a resulting bit sequence of eight-bit bytes and is inverse-transformed into a bit sequence of nine-bit bytes.

Two cyceles are therefore indispensable in the Kindell et al system for the transformation and the inverse transformation before and after each arithmetic operation. An accordingly long time is necessary on completing execution of each instruction. In other words, the data processing system has not a high data processing speed. In addition, the hardware architecture is inevitably rendered intricate by the means for carrying out transformation between the two data formats.

SUMMARY OF THE INVENTION

It is therefore an object of the present invention to provide a shift circuit for use in a packed nine-bit-byte data processing system in storing a nine-bit-byte datum in a preselected one of a plurality of registers, such as an operand register, which circuit renders it unnecessary for the data processing system to carry out transformation between nine-bit-byte data and eight-bit-byte data.

It is another object of this invention to provide a shift circuit of the type described, which raises the data processing speed of the packed nin-bit-byte data processing system.

It is still another object of this invention to provide a shift circuit of the type described, which simplifies the hardware structure of the packed nine-bit-byte data processing system.

A shift circuit to which this invention is applicable, is for use in storing an edited datum in a preselected one of a plurality of registers in a data processing system for processing a plurality of packed nine-bit-byte data, each of which is representative of a number given by a predetermined number of digits in a predetermined number system and is given by a bit sequence of a prescribed number of nine-bit bytes consecutively arranged from the most significant bit of the bit sequence to the least significant bit thereof. Each nine-bit byte consists of a prescribed binary bit and two four-bit bytes consecutively arranged in a direction from the most significant bit to the least significant bit. The digits are represented by predetermined ones of the four-bit bytes in the bit sequence, respectively. According to this invention, the shift circuit comprises shift means and editing means.

The shift means is for subjecting a preselected one of the nine-bit-byte data to a shift of a preselected whole number N of four-bit bytes to produce a shifted datum. The shift is towards the most significant bit and is a shift of $[9N/2]$ bits and of $[9(n-1)/2+5]$ bits when the preselected whole number N is an even and an odd integer, respectively. The shifted datum is given by a shifted bit sequence wherein one of the four-bit bytes representative of the least significant digit includes the least significant bit of the shifted bit sequence.

The editing means is for editing the shifted datum into the edited datum. The editing means produces the shifted datum as the edited datum as it stands when the preselected whole number N is the even integer. The editing means produces the edited datum after rearranging, when the preselected whole number N is the odd integer, the shifted bit sequence into an edited bit sequence wherein each prescribed binary bit is placed at a bit which is next more significant than a particular four-bit byte, which particular four-bit byte is a four-bit byte which is next more significant in the shifted bit sequence than the last-mentioned each prescribed binary bit.

BRIEF DESCRIPTION OF THE DRAWING:

FIG. 3 schematically shows a few memory locations of a main memory of the data processing system portion illustrated in FIG. 2;

FIGS. 5 (A) and (B) show several sequences of nine-bit bytes for use in describing operation of a shift circuit of the type depicted in FIG. 2;

FIG. 7 shows a resulting datum for use in describing operation of the shift circuit depicted in FIG. 2; and FIG. 8 shows an edited datum obtained from the resulting datum by the shift circuit shown in FIG. 2 and comprising the editor illustrated in FIG. 6.

Figure 1:
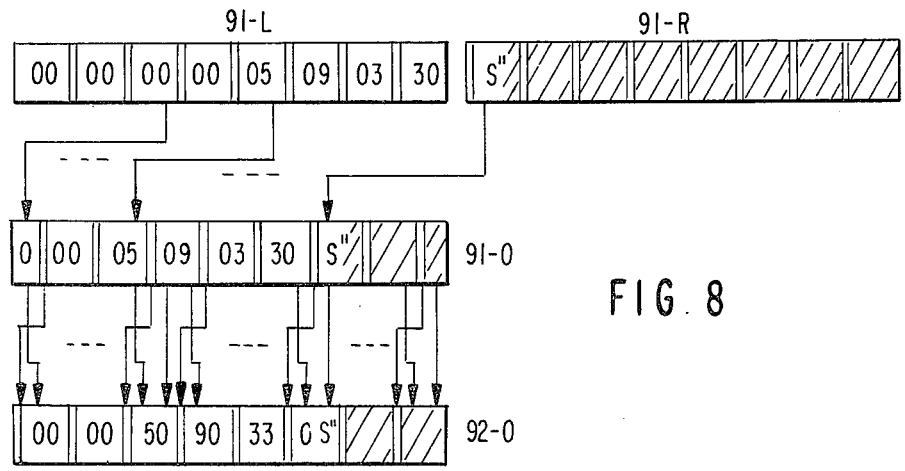
FIGS. 1 (A) and (B) show a nine-bit-byte datum and an eight-bit-byte datum, respectively, for use in describing transformation of the nine-bit-byte datum into the eight-bit-byte datum in a conventional packed nine-bit-byte data processing system.

DESCRIPTION OF THE PREFERRED EMBODIMENTS:

Referring to FIG. 1 (A), a datum is given in a first data format given by a bit sequence of seventy-two bits which are referred to as bit number 0 through bit number 71 from the most significant bit, or the bit number 0, to the least significant bit, or the bit number 71. The sequence is divided into eight nine-bit bytes which are consecutively arranged at the bit numbers 0 through 8, the bit numbers 9 through 17, . . ., and the bit numbers 63 through 71, respectively. Each nine-bit byte consists of a prescribed binary bit, a first four-bit byte, and a second four-bit byte which are consecutively arranged in a direction or sense from the most significant bit to the least significant bit. Each of the prescribed binary bits in the respective nine-bit bytes is representative of a prescribed one of two binary numbers, such as a binary zero. The datum represets a number given by a predetermined number of digits in a predetermined number system, such as a sixteen-digit binary-coded decimal or hexadecimal number. The digits are represented by predetermined ones of the first and the second four-bit bytes, respectively, as will later be described. A number having a less number of digits is readily given as a number having the predetermined number of digits by adding one or more zeros to the former with an equality kept between the former and the latter. It will be assumed in the following that each datum represents a seven-digit binary-coded decimal number merely for simplicity of description.

Turning to FIG. 1 (B), each datum of the first data format is transformed, on subjecting such data to an arithmetic operation in a conventional packed nine-bit-byte decimal data processing system, into a datum of a second data format. During the transformation, the prescribed binary bit is stripped off each nine-bit byte. The eight remaining eight-bit bytes are concatenated into a concatenation which consists of sixty-four bits. As is the case with the first data format, the second data format is given by a bit sequence of seventy-two bits which are called bit number 0 through bit number 71 from the most significant bit to the least significant bit. In the second data format, eight prescribed binary bits are placed at the bit numbers 0 through 7 and followed by the concatenation at the bit numbers 8 through 71.

Figure 2:
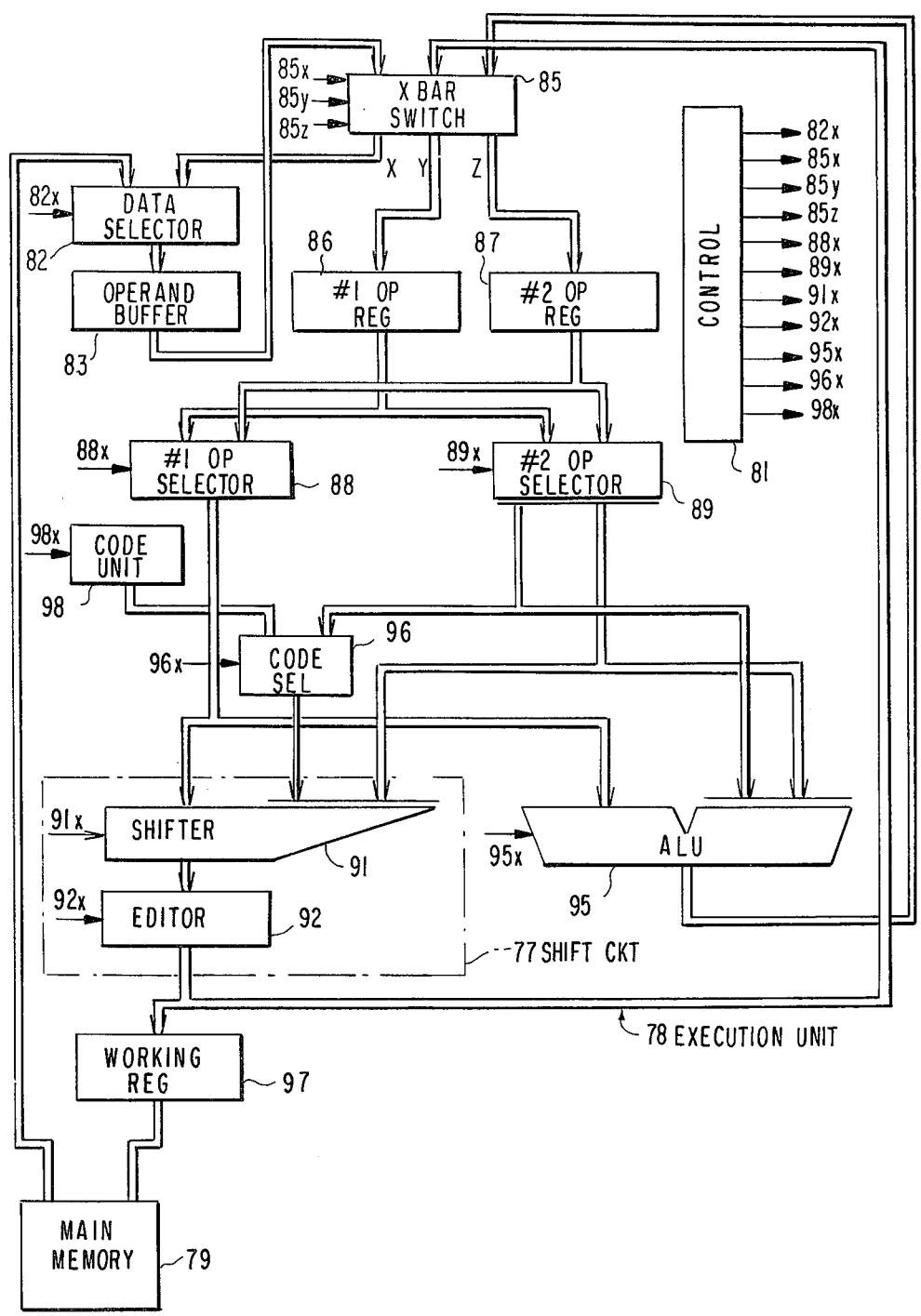
FIG. 2 shows, in blocks, a shift circuit according to the instant invention together with a portion of a packed nine-bit-byte data processing system, which portion is not much different from a corresponding portion of the system mentioned in conjunction with FIG. 1.

Referring now to FIG. 2, a packed nine-bit-byte decimal data processing system comprises a shift circuit 77 according to the present invention. The system further comprises an execution unit 78, a main memory 79, and a control unit 81. The illustrated portion of the system is not different in principle from the corresponding portion of the conventional system except for the shift circuit 77. For example, the execution unit 78 and the main memory 79 correspond, in the Kindell et al patent referred to hereinabove, to the execution unit 714 and the cache unit 750 described in general with reference to FIG. 1 thereof. The control unit 81 is a counterpart of the auxiliary arithmetic and control unit 722 at least as regards shift control signals, which will presently be described. It is possible to implement the control unit 81 by a microprocessor. By resorting to the microprogramming technique, the control unit 81 is made to produce various control signals which will become clear as the description proceeds.

Turning to FIG. 3, the main memory 79 has a plurality of memory location or addresses. Each memory location is for eight nine-bit bytes, namely for seventy-two bits, and has memory bit positions numbered from 0 to 71.

Two data are stored in two memory locations A and B, respectively. The two data are inclusive of first and second operands Op1 and Op2. Four nine-bit bytes representative of the first operand Op1 are stored in the memory bit positions 27 through 62 of the memory location A. Four nine-bit bytes representative of the second operand Op2 are stored in the bit positions 5 through 40 of the memory location B. It will be assumed that the first and the second operands Op1 and Op2 are representative of decimal 1324687 and 3765643, respectively.

The first and the second operands Op1 and Op2 are inclusive of additional four-bit codes S and S', respectively. To speak of the first operand Op1, the first through the seventh digits of the number 1324687 are represented by four first and three second four-bit bytes positioned at the bit positions 28 through 35, the bit positions 37 through 44, the bit positions 46 through 53, and the bit positions 55 through 58. As the case may be, the two data will be referred to merely as the first and the second operands Op1 and Op2. The codes S and S' may represent signs, respectively. The digit represented by the four-bit byte which is next more significant than the digit corresponding to the code S or S', will be called the least significant digit.

Another memory location C is for storing a new datum. A third operand Op3 is to be stored in the bit positions 18 through 53 as will later be described.

In the memory locations A through C, binary zeros are stored as the prescribed binary bits of the respective nine-bit bytes. Hatched areas are representative of non-operand bits.

Figure 4:
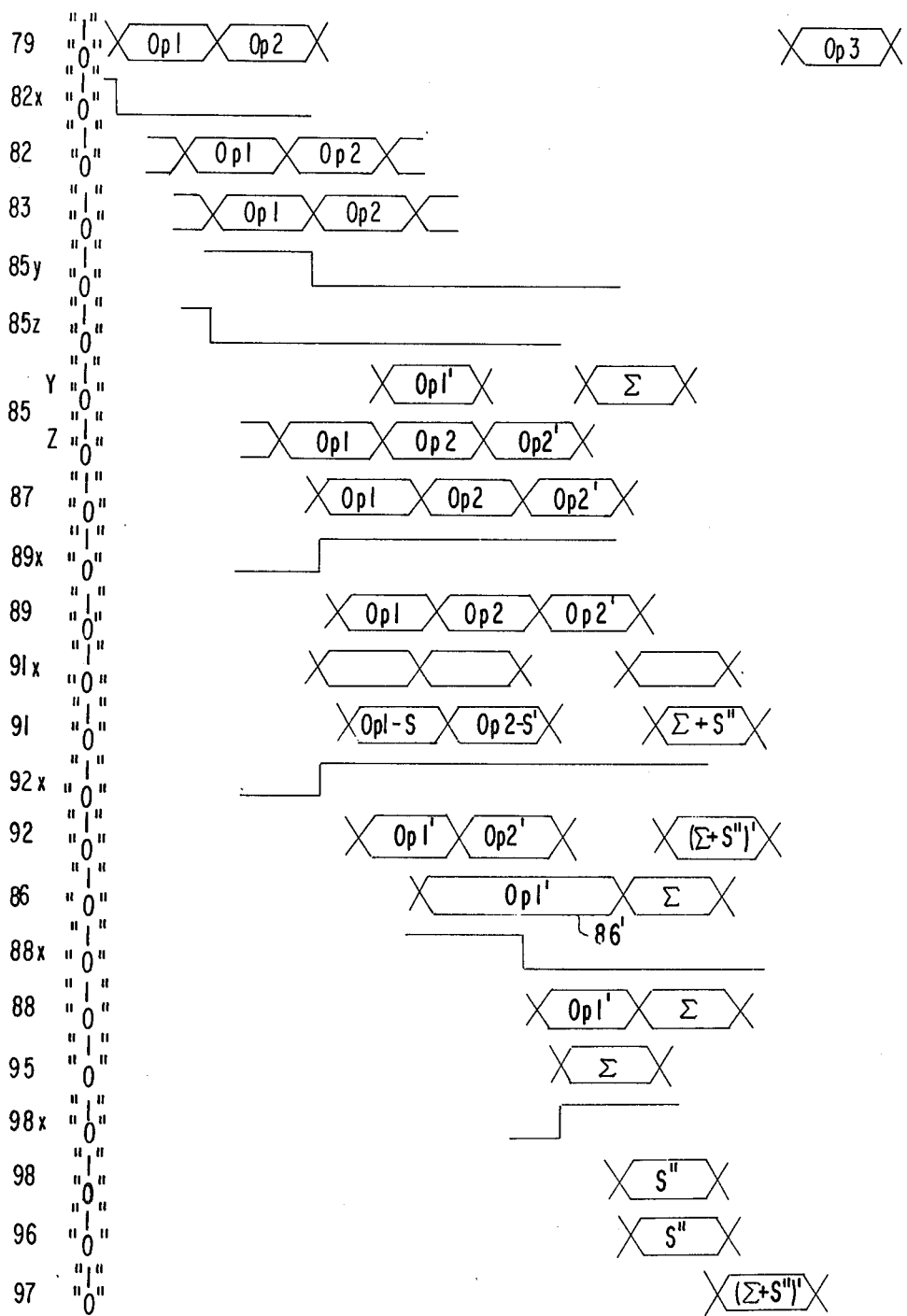
FIG. 4 is a time chart for use in describing operation of the data processing system portion shown in FIG. 2.

Referring afresh to FIG. 4 and again to FIGS. 2 and 3, the first operand Op1 is read from the main memory 79 in the manner known in the art and delivered to a data selector 82. Responsive to a data selection signal 82x produced by the control unit 81, the first operand Op1 is delivered to an operand buffer 83 and is supplied thence to a crossbar switch 85. The operand buffer 83 corresponds, in the above-referenced Kindell et al patent, to the scratch pad memory 714–30 described with reference to FIG. 2 thereof. The operand buffer 83 may be for four words, each consisting of seventy-two bits. In FIG. 4, "1" and "0" are indicative of binary one and zero.

When supplied with a first crossbar selection signal 85x from the control unit 81, the crossbar switch 85 delivers a datum supplied thereto to the data selector 82 through a first output lead X. Responsive to a second crossbar selection signal 85y, the crossbar switch 85 delivers a similar datum to a first operand register 86 through a second output lead Y. Responsive to a third crossbar selection signal 85z, the crossbar switch 85 delivers a like datum to a second operand register 87 through a third output lead Z. The data selector 82 is responsive to the data selection signal 82x for selecting one of the data supplied thereto from the main memory 79 and from the crossbar switch 85 to deliver the selected datum to the operand buffer 83.

Each of the first and the second operand registers 86 and 87 is for eight nine-bit bytes and is accompanied by first and second operand selectors 88 and 89. As will later become clear, the first and the second operand selectors 88 and 89 are controlled by first and second operand selector control signals 88x and 89x, respectively.

The shift circuit 77 comprises a shifter 91 and an editor 92. The shifter 91 corresponds, in the above-cited Kindell et al patent, to the shifter 714-24 described with reference to FIG. 2 thereof. The shifter 91 has left and right input ports and a single output port and is controlled by a shift count signal 91x, which will shortly be described. Each of the left and the right input ports and the output port is for a bit sequence of eight nine-bit bytes. The editor 92 has no counterpart in the Kindell et al patent and is novel. An editor control signal 92x is supplied to the editor 92 from the control unit 81. The editor 92 will later be described in detail.

As will presently be described, the first operand selector 88 is for delivering a bit sequence from one of the first and the second operand registers 86 and 87 to the left input port and to an arithmetic unit 95 under the control of the first operand selector control signal 88x. The arithmetic unit 95 corresponds, in the above-referenced Kindell et al patent, to the arithmetic units 714-20 and 714-26 described with reference to FIG. 2 thereof. The arithmetic unit 95 is supplied with an operation mode signal 95x from the control unit 81 in the known manner.

The second operand selector 89 is for delivering a bit sequence from one of the first and the second operand registers 86 and 87 to the right input port and also to the arithmetic unit 95, depending on the second operand selector control signal 89x. The second operand selector 89 delivers the bit numbers 0 through 4 of the datum written in one of the first and the the second operand registers 86 and 87 to the correspondingly numbered bit positions of the right input port through a code selector 96, which is controlled by a code selection signal 96x ordinally to feed the bits 0 through 4 directly to the right input port. The second operand selector 89 delivers the remaining bits of the datum directly to the right input port.

A bit sequence of eight nine-bit bytes delivered to the right input port of the shifter 91 serve as an extension, beyond the least significant bit, of a bit sequence which may be delivered to the left input port. The respective bit positions of the sequence delivered to the right input port therefore correspond to bit positions 72 through 143 of the sequence delivered to the left input port.

Responsive to the third crossbar selection signal 85z produced by the control unit 81, the second operand register 87 is loaded with the first operand Op1. Controlled by the second operend selector control signal 89x, the second operand selector 89 delivers the first operand Op1 to the right input port of the shifter 91 from the second operand register 87.

Referring anew to FIGS. 5 (A) and (B) in addition to FIGS. 2 through 4, the bit sequence delivered to the left and the right input ports of the shifter 91 at different instants, are depicted at 91-L and 91-R separately for clarity of illustration. Bits produced from the output port are illustrated in alignment with the bit positions of the left input port as shown at 91-o.

With reference to the memory bit positions at which the first operand Op1 is stored in the main memory 79, the control unit 81 makes the shift count signal 91x indicate a leftward shift of thirteen digits or, more particularly, $[9(N-1)+5]$ bits, where N represents the number of digits of the leftward shift with which the bit sequence delivered to the right input port should be shifted towards the most significant bit position of the left input port.

As depicted in FIG. 5 (A) at 91-o, the first operand Op1 is produced from the output port in a shifted or output bit sequence with the additional four-bit byte or code S stripped. The first four-bit byte representative of the least significant digit of the decimal number given in the first operand Op1, includes the least significant bit of the shifted bit sequence.

Figure 6:
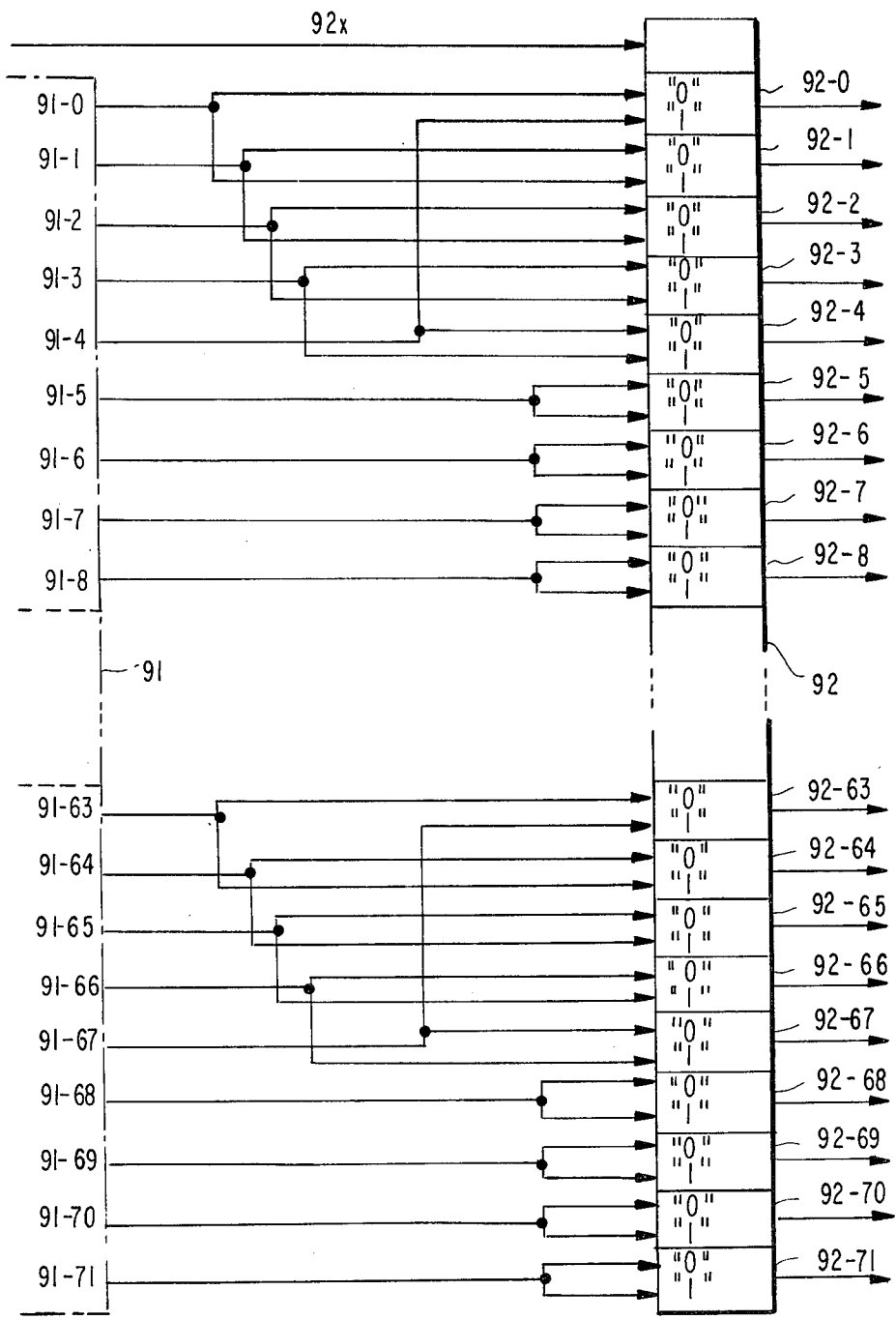
FIG. 6 is a block diagram of an editor for use in the shift circuit illustrated in FIG. 2.

Turning to FIG. 6, the editor 92 is supplied with the shifted bit sequence from the output port of the shifter 91 and with the editor control signal 92x from the control unit 81. It is possible to understand that the output port has zeroth through seventy-first output bit positions 91-0 to 91-71 for the most significant bit, or the bit number 0, through the least significant bit, or the bit number 71, of the shifted bit sequence. The bit positions 91-0 through 91-71 are grouped into zeroth through seventh position groups for the eight nine-bit bytes of the shifted bit sequence, respectively. Each position group consists of zeroth through eighth output bit positions as counted serially in each position group in the direction from the most significant bit position 91-0 to the least significant one 91-71. The expression "position group" is used in order merely to clarify the relationships between the bits 0 through 71 of the shifted bit sequence and the output bit positions 91-0 through 91-71 as will presently become clear.

In order to distinguish the serial number in each position group from the serial number for all output bit positions, the former will be called sub-zeroth through sub-eighth. When so named, the sub-zeroth through the sub-eighth positions of the zeroth position group are the zeroth through the eighth output bit positions 91-0 to 91-8. Likewise, the sub-zeroth through the sub-eighth bit positions of the seventh position group are the sixty-third through the seventy-first output bit positions 91-63 to 91-71. For the shifted bit sequence which comprises the first operand Op1, the sub-fourth bit positions 91-4, . . ., and 91-67 in the respective position groups are for the prescribed binary bits. The sub-fifth through the sub-eighth bit positions 91-5 to 91-8, . . ., or 91-68 to 91-71 in each position group are for each first four-bit byte. The sub-zeroth through the sub-third bit positions 91-0 to 91-3, . . ., or 91-63 to 91-66 in each position group are for each second four-bit byte.

The editor 92 may comprise zeroth through seventy-first two-input cells 92-0 to 92-71. Each cell has first and second input terminals "0" and "1" and a single output terminal. The output terminals of the respective cells 92-0 through 92-71 are connected to the crossbar switch 85 and to a working or result register 97 as illustrated in FIG. 2. Although now shown, a chip enable control signal of the type known in the art, may be supplied to the editor 92 so as to clear the non-operand bits to binary zeros as depicted in FIG. 5 (A) at 92-o.

The zeroth through the seventy-first cells 92-0 to 92-71 are grouped into zeroth through seventh sectors or cell groups for the eight respective nine-bit bytes of the shifted bit sequence supplied from the output port of the shifter 91. Each sector consists of sub-zeroth through sub-eighth cells. For example, the zeroth sector consists of sub-zeroth through sub-eighth cells 92-0 to 92-8. The seventh sector consists of sub-zeroth through sub-eighth cells 92-63 to 92-71. The word "sector" is used for mere convenience of describing the relationships between the output bit positions 91-0 through 91-71 and the first and the second input terminals "0" and "1" of the cells 92-0 through 92-71.

The first input terminals "0"'s of the zeroth through the seventy-first cells 92-0 to 92-71 are connected to the zeroth through the seventy-first output bit positions 92-0 to 91-71 of the shifter 91, respectively. The second input terminals "1"'s of the sub-zeroth cells 92-0, ..., and 92-63 of the zeroth through the seventh sectors, are connected to the sub-fourth bit positions 91-4, ..., and 91-67 of the zeroth through the seventh position groups, respectively. The second input terminals "1"'s of the sub-first through the sub-fourth cells 92-1 to 92-4, ..., and 92-64 to 92-67 of the zeroth through the seventh sectors, are connected to the sub-zeroth through the sub-third bit positions 91-0 to 91-3, ..., and 91-63 to 91-66 of the zeroth through the seventh position groups, respectively. The second input terminals "1"'s of the sub-fifth through the sub-eighth cells 92-5 to 92-8, ..., and 92-68 to 92-71 of the zeroth through the seventh sectors, are connected to the sub-fifth through the sub-eighth bit positions 91-5 to 91-8, ..., and 91-68 to 91-71 of the zeroth through the seventh position groups, respectively.

Referring back to FIGS. 2 through 6 and additionally to FIG. 7, the control unit 81 makes the editor control signal 92x select the bits supplied to the second input terminals "1"'s of the respective cells 92-0 through 92-71 as an edited bit sequence when the shift count signal 91x is indicative of a shift of an odd number of digits, such as thirteen digits. As described heretobefore, the editor 92 supplies the edited bit sequence to the crossbar switch 85. The edited bit sequence includes an edited first operand Op1'. In the case under consideration, the prescribed binary bits produced at the output bit positions 91-4, ..., and 91-67 are placed at a plurality of bits which are next more significant in the edited bit sequence than the second four-bit bytes produced at the output bit positions 91-0 through 91-3, ..., and 91-63 through 91-66, respectively, as depicted in FIG. 5 (A) at 92-o. Responsive to the second crossbar selection signal 85y, the edited bit sequence is delivered to the first operand register 86 and is therein retained during two machine cycles as indicated in FIG. 4 at 86'.

The second operand Op2 is similarly read from the main memory 79 and written in the second operand register 87 through the data selector 82, the operand buffer 83, and the crossbar switch 85 and is delivered to the right input port of the shifter 91 through the second operand selector 89. The shift count signal 91x now indicates a leftward shift of eight digits or, more specifically, [9N/2] bits. As depicted in FIG. 5 (B) at 91-o, the second operand Op2 is supplied to the editor 92 with the additional four-bit byte or code S' stripped. One of the second four-bit bytes that represents the least significant digit, includes the least significant bit of the shifted bit sequence.

The control unit 81 makes the editor control signal 92x select the bits supplied to the first input terminals "0"'s of the respective cells 92-0 through 92-71 as the bits of another edited bit sequence because the shift count signal 91x indicates a shift of an even integer of digits, such as eight digits. The editor 92 therefore produces the second operand Op2 as an edited second operand Op2' as it stands except for the code S' as illustrated in FIG. 5 (B) at 92-o. Responsive to the third crossbar selection signal 85z, the edited second operand Op2' is written in the second operand register 87.

Responsive to the first and the second operand selector control signals 88x an 89x, the edited first operand Op1' and the edited second operand Op2' are delivered to the arithmetic unit 95 through the first an the second operand selectors 88 and 89, respectively. Supplied with the operation mode signal 95x from the control unit 81, the arithmetic unit 95 subjects the edited operands Op1' and Op2' to an arithmetic operation specified by the operation mode signal 95x.

In the numerical example being illustrated, the edited first operand Op1' is representative of a succession of a decimal 1, the binary zero, two decimals 3 and 2, the binary zero, two decimals 4 and 6, the binary zero, and two decimals 8 and 7. The edited second operand Op2' represents another succession of a decimal 3, the binary zero, two decimals 7 an 6, the binary zero, two decimals 5 and 6, the binary zero, and two decimals 4 and 3.

As depicted in FIG. 7, the arithmetic unit 95 produces a partial result of the arithmetic operation $\Sigma$ as a partial result bit sequence. When the operation mode signal 95x indicates addition, the partial result bit sequence gives a succession of a decimal 5, the binary zero, two decimals 0 and 9, the binary zero, two decimals 0 an 3, the binary zero, and two decimals 3 and 0. One of four-bit bytes that represents the least significant digit in the partial result bit sequence, includes the least significant bit thereof.

Responsive to the second crossbar selection signal 85y, the partial result bit sequence is written in the first operand register 86. The first operand selector control signal 88x makes the first operand selector 88 deliver the partial result bit sequence to the left input port of the shifter 91.

A code unit 98 is for retaining a resulting code S" obtained in the known manner with reference to the codes S and S' and the arithmetic operation indicated by the operation mode signal 95x. Supplied with a code output signal 98x from the control unit 81, the code unit 98 produces the resulting code S". Responsive to the code selection signal 96x, the code selector 96 selects the resulting code S" and delivers the same to the bit positions 1 through 4 of the right input port of the shifter 91. It is now understood that at least the bit positions 0 through 4 of the right input port serve as an additional input port for the left input port.

Referring furthermore to FIG. 8, the partial result bit sequence received at the left input port of the shifter 91 is illustrated at 91-L. The resulting code S" received at the right input port is depicted at 91-R. With reference to the memory bit positions 18 through 53 of the memory location C shown in FIG. 3, the control unit 81 makes the shift count signal 91x indicate a leftward shift of five digits, namely, [9(N−1)/2+5] bits. The shifter 91 produces a new shifted bit sequence illustrated at 91-o. The new shifted bit sequence includes an eventual result ($\Sigma$+S") of the arithmetic operation. As described heretobefore, the editor 92 rearranges the new shifted bit sequence into a new edited bit sequence depicted at 92-o. The new edited bit sequence is representative of a new datum, which includes an edited result ($\Sigma$+S")' of the arithmetic operation. The new edited bit sequence is written in the working register 97 and stored thence in the main memory 79 as the above-mentioned third operand Op3.

In contrast to a packed nine-bit-byte data processing system comprising a shift circuit 77 of the type thus far described, a conventional packed nine-bit-byte data processing system carries out an arithmetic operation in three following steps.

(1) Each nine-bit-byte datum is transformed into an eight-bit-byte datum as illustrated with reference to FIG. 1.

(2) An arithmetic operation is carried out on such data. A resulting datum is given by a plurality of eight-bit bytes.

(3) The resulting datum is inverse-transformed into a nine-bit-byte datum by adding the prescribed binary bit at a bit next more significant than each eight-bit byte of the resulting datum.

In marked contrast, two of the three above-described steps, namely, the steps (1) and (3), are rendered unnecessary when a packed nine-bit-byte data processing system is equipped with a shift circuit according to this invention.

While a preferred embodiment of this invention has so far been described with reference to the accompanying drawing, it will now be readily feasible for one skilled in the art to derive various other embodiments of this invention from the above description. For example, the shifted bit sequence representative of the resulting datum may be produced as it is as an edited bit sequence when the shift is of an even number in terms of the digits of the number used in the data processing system. In the shift circuit 77, the sub-fifth through the sub-eighth bit positions of each position group of the shifter 91 may be connected directly to the crossbar switch 85 and to the working register 97 insofar as edition of each shifted bit sequence into an edited bit sequence is concerned.

The shifter 91 may have only the left input port and the additional input port mentioned hereinabove. In this event, the bit sequence to be subjected to an arithmetic operation should be supplied to the left input port. For the shift, the shift count signal 91x should indicate the number of bits which is congruent to [9N/2] or [9(N−1)/2+5] bits modulo seventy-two bits. Alternatively, the shifter 91 may comprise only the left input port. In this latter case, a resulting bit sequence should be shifted at first five bits towards the most significant bit position of the single input port. The resulting code S″ should be supplied to the bit positions 69 through 71 with the prescribed binary bit supplied to the bit position 68. The shift count signal 91x for a subsequent shift should indicate the above-mentioned number of bits less five bits. In either event, the editor 92 should edit the shifted bit sequence dependent on whether the preselected whole number N used in the number of bits [9N/2] or [9(N−1)/2+5], is an even or an odd integer.

What is claimed is:

1. A shift circuit for use in storing an edited datum in a preselected one of a plurality of registers in a data processing system for processing a plurality of packed nine-bit-byte data, each of said data being representative of a number given by a predetermined number of digits in a predetermined number system and being given by a bit sequence of a prescribed number of nine-bit byte consecutively arranged from the most significant bit of said sequence to the least significant bit thereof, each nine-bit byte consisting of a prescribed binary bit and two four-bit bytes consecutively arranged in a direction from said most significant bit to said least significant bit, said digits being represented by predetermined ones of the four-bit bytes in said sequence, respectively, said shift circuit comprising:

shift means for subjecting a preselected one of said nine-bit-byte data to a shift of a preselected whole number N of four-bit bytes to produce a shifted datum, said shift being towards said most significant bit and a shift of [9N/2] bits and of [9(N−1)/2+5] bits when said preselected whole number N is an even and an odd integer, respectively, said shifted datum being given by a shifted bit sequence wherein one of the four-bit bytes representative of the least significant digit includes the least significant bit of said shifted bit sequence; and editing means for editing said shifted datum into said edited datum, said editing means producing said shifted datum as said edited datum as it stands when said preselected whole number N is said even integer, said editing means producing said edited datum after rearranging, when said preselected whole number N is said odd integer, said shifted bit sequence into an edited bit sequence wherein each prescribed binary bit is placed at a bit which is next more significant than a particular four-bit byte, said particular four-bit byte being one of the four-bit bytes in said shifted bit sequence that is next more significant therein than the last-mentioned each prescribed binary bit.

2. A shift circuit as claimed in claim 1, wherein: said shift means has zeroth through (9K-1)-th output bit positions where K represents said prescribed number, said zeroth through said (9K-1)-th positions being for the most significant through the least significant bits of said shifted bit sequence, respectively, and being grouped into zeroth through (K-1)-th position groups, each position group consisting of sub-zeroth through sub-eighth output bit positions, said shift means producing the prescribed binary bit at the sub-zeroth and the sub-fourth positions in each position group when said preselected whole number N is said even and said odd integers, respectively;

said editing means comprising:

zeroth through (9K-1)-th two-input cells, each cell having first and second input terminals and an output terminal, said zeroth through said (9k-1)-th cells being grouped into zeroth through (K-1)-th cell groups, each cell group consisting of sub-zeroth through sub-eighth two-input cells;

means connecting the first input terminals of said zeroth through said (9K-1)-th cells to said zerth through said (9K-1)-th positions, respectively;

means connecting the second input terminals of the sub-zeroth cells in said zeroth through said (K-1)-th cell groups to the sub-fourth positions of said zeorth through said (K-1)-th position groups, respectively;

means connecting the second input terminals of the sub-first through the sub-fourth cells of said zeroth through said (K-1)-th cell groups to the sub-zeroth through the sub-third positions of said zeroth through said (K-1)-th position groups, respectively;

means connecting the second input terminals of the sub-fifth through the sub-eight cells of said zeroth through said (K-1)-th cell groups to the sub-fifth through the sub-eighth positions of said zeroth through said (K-1)-th position groups, respectively; and means for coupling the first input terminal and the second input terminal to the output terminal in each of said zeroth through said (9K-1)-th cells when said preselected whole number N is said even and said odd integers, respectively.

3. A shift circuit as claimed in claims 1 or 2, wherein said shift means comprises a principal input port for each bit sequence to be shifted, and an additional input port for a prescribed number of bits, said additional input port serving as an extension of said principal inut port beyond the least significant bit of the last-mentioned each bit sequence.

* * * * *

UNITED STATES PATENT AND TRADEMARK OFFICE
CERTIFICATE OF CORRECTION

PATENT NO. : 4,473,894

DATED : Sep. 25, 1984

INVENTOR(S) : Toshio YAGIHASHI

It is certified that error appears in the above-identified patent and that said Letters Patent is hereby corrected as shown below:

Column 1, line 44, "cyceles" should be --cycles--;

line 65, "nin" should be --nine--.

Column 6, line 32, add --bit-- after "sub-eighth".

Column 7, line 4, "92-0" should be --91-0--.

Column 10, line 65, "inut" should be --input--.

Signed and Sealed this

Second Day of April 1985

[SEAL]

Attest:

DONALD J. QUIGG

Attesting Officer

Acting Commissioner of Patents and Trademarks